(12) United States Patent
Jin et al.

(10) Patent No.: US 11,961,924 B1
(45) Date of Patent: Apr. 16, 2024

(54) SOLAR CELL AND PHOTOVOLTAIC MODULE

(71) Applicant: ZHEJIANG JINKO SOLAR CO., LTD., Zhejiang (CN)

(72) Inventors: Jingsheng Jin, Zhejiang (CN); Guangming Liao, Zhejiang (CN)

(73) Assignee: ZHEJIANG JINKO SOLAR CO., LTD., Zhejiang (CN)

( * ) Notice: Subject to any disclaimer, the term of this patent is extended or adjusted under 35 U.S.C. 154(b) by 0 days.

(21) Appl. No.: 18/178,323

(22) Filed: Mar. 3, 2023

(30) Foreign Application Priority Data

Nov. 28, 2022 (CN) .......................... 202211495832.6

(51) Int. Cl.
  *H01L 31/0224* (2006.01)
  *H01L 31/048* (2014.01)
  *H01L 31/05* (2014.01)
  *H01L 31/068* (2012.01)

(52) U.S. Cl.
  CPC ............... *H01L 31/022425* (2013.01); *H01L 31/022441* (2013.01); *H01L 31/048* (2013.01); *H01L 31/068* (2013.01); *H01L 31/0504* (2013.01)

(58) Field of Classification Search
  CPC ..... H01L 31/022425; H01L 31/022441; H01L 31/048
  See application file for complete search history.

(56) References Cited

U.S. PATENT DOCUMENTS

2008/0041434 A1* 2/2008 Adriani .................. H02S 40/36
136/244

FOREIGN PATENT DOCUMENTS

| CN | 104157726 A | 11/2014 |
|---|---|---|
| CN | 111969071 A | 11/2020 |
| CN | 113629155 A | 11/2021 |
| CN | 114600255 A | 6/2022 |
| CN | 114649424 A | 6/2022 |
| CN | 115172477 A | 10/2022 |
| CN | 115207159 A | 10/2022 |
| CN | 115241299 A | 10/2022 |
| CN | 115347059 A | 11/2022 |
| EP | 3223318 A1 * | 9/2017 |
| JP | 2014229633 A | 12/2014 |
| WO | 2014054457 A1 | 4/2014 |

OTHER PUBLICATIONS

English machine translation of CN 113629155A. (Year: 2021).*

(Continued)

*Primary Examiner* — Lindsey A Buck
(74) *Attorney, Agent, or Firm* — TAROLLI, SUNDHEIM, COVELL & TUMMINO L.L.P.

(57) ABSTRACT

A solar cell and a photovoltaic module, including a substrate and a first electrode. The first electrode is arranged on a surface of the substrate and electrically connected to the substrate. Along a thickness direction of the substrate, the first electrode is provided with a first conductive layer, a second conductive layer, and a first transport layer. The first transport layer is located between the first conductive layer and the second conductive layer, and the first transport layer is made of a semiconductor material and configured to electrically connect the first conductive layer with the second conductive layer.

20 Claims, 3 Drawing Sheets

(56) References Cited

OTHER PUBLICATIONS

Notice of Grant dated Feb. 23, 2023 for corresponding CN Application No. 202211495832.6.
CN Office Action dated Jan. 18, 2023, for corresponding CN Application No. 202211495832.6; and English translation thereof.
CN Office Action dated Feb. 5, 2023, for corresponding CN Application No. 202211495832.6; and English translation thereof.
Taras T. Kovaliuk, Effect of annealing on electrical and optical properties of TiN thin films; Fifteenth International Conference on Correlation Optics, edited by Oleg V. Angelsky, Pro. of SPIE vol. 12126, 121260B; pp. 1-6.
Extended European Search report and European search opinion for corresponding Application Serial No. 23159083.7-1002, dated Oct. 10, 2023, pp. 1-12.

\* cited by examiner

SOLAR CELL AND PHOTOVOLTAIC MODULE

CROSS-REFERENCE TO RELATED APPLICATIONS

The present application claims priority to Chinese Patent Application No. 202211495832.6, filed on Nov. 28, 2022, the content of which is incorporated herein by reference in its entirety.

TECHNICAL FIELD

The present disclosure relates to the technical field of solar cells and, in particular, to a solar cell and a photovoltaic module.

BACKGROUND

With the development of technologies, solar cells are applied to various application fields. Electrodes in the solar cells are generally manufactured from metal paste. The metal paste is prone to a sharp wedge effect during sintering, which may easily affect overall performance of the solar cells. Moreover, at present, the metal paste required by the electrodes have higher costs, resulting in an increasing manufacturing costs of entire solar cells.

SUMMARY

The present disclosure provides a solar cell and a photovoltaic module to solve the problem that the solar cell is prone to the sharp wedge phenomenon, which can reduce manufacturing costs of the solar cell.

A first aspect of the present disclosure provides a solar cell, including a substrate and at least one first electrode arranged on a surface of the substrate and electrically connected to the substrate, along a thickness direction of the substrate, the first electrode is provided with a first conductive layer, a second conductive layer, and a first transport layer, the first transport layer is located between the first conductive layer and the second conductive layer, and the first transport layer is made of a semiconductor material and configured to electrically connect the first conductive layer with the second conductive layer.

In some embodiments, an electrical conductivity of the first conductive layer and an electrical conductivity of the second conductive layer are greater than an electrical conductivity of the first transport layer.

In some embodiments, the semiconductor material includes at least one of polycrystalline silicon, microcrystalline silicon, amorphous silicon, or nanocrystalline silicon.

In some embodiments, the first transport layer is a doped semiconductor layer, a doped region is formed between the first transport layer and the first conductive layer and/or the second conductive layer, and the doped region is a P-type doped region or an N-type doped region.

In some embodiments, the first transport layer is an intrinsic semiconductor layer.

In some embodiments, the first conductive layer and the second conductive layer are metallic material layers, and metal components of the first conductive layer are different from the second conductive layer.

In some embodiments, the first conductive layer is located on one side of a surface of the first transport layer close to the substrate, the first conductive layer is sintered by a silver-aluminum paste, and the second conductive layer is sintered by an aluminum paste or a silver-aluminum paste.

In some embodiments, along the thickness direction of the substrate, a thickness D1 of the first conductive layer satisfies: 1 μm≤D1≤10 μm, a thickness D2 of the first transport layer satisfies: 10 μm≤D2≤1000 μm, and a thickness D3 of the second conductive layer satisfies: 5 μm≤D3≤50 μm.

In some embodiments, the substrate includes a first surface and a second surface opposite to each other along the thickness direction, and the solar cell further comprises a second electrode electrically connected with the substrate, and one of the first surface and the second surface is provided with the first electrode and the other is provided with the second electrode.

In some embodiments, the second electrode includes a third conductive layer, a fourth conductive layer, and a second transport layer along the thickness direction, the second transport layer is located between the third conductive layer and the fourth conductive layer, and the second transport layer is made of a semiconductor material and configured to electrically connect the third conductive layer with the fourth conductive layer.

In some embodiments, the substrate includes a first surface and a second surface opposite to each other along the thickness direction, and the first electrode is arranged on both the first surface and the second surface.

In some embodiments, along a direction away from the substrate, the first surface is successively provided with an emitter and a first passivation film, the first electrode is arranged on one side of the first passivation film away from the emitter, and the first electrode penetrates through the first passivation film and is electrically connected to the emitter.

In some embodiments, the substrate is a silicon substrate having a first doping polarity, the first transport layer is a semiconductor layer having a second doping polarity opposite to the first doping polarity.

In some embodiments, along a direction away from the substrate, the second surface is successively provided with a tunneling layer, a doped conductive layer, and a second passivation film, the first electrode is arranged on one side of the second passivation film away from the tunneling layer, and the first electrode penetrates through the second passivation film and is electrically connected to the doped conductive layer.

In some embodiments, the substrate is a silicon substrate having a first doping polarity, and the first transport layer is a semiconductor layer having a second doping polarity, the first doping polarity is the same as the second doping polarity, and the second doping polarity is the same as a doping polarity of the doped conductive layer.

A second aspect of the present disclosure further provides a photovoltaic module, including at least one solar cell string formed by electrically connecting a plurality of solar cells of the first aspect, at least one packaging layer covering a surface of the solar cell string, and at least one cover plate covering a surface of the packaging layer away from the solar cell string.

It should be understood that the general description above and the detailed description in the following are merely exemplary and cannot limit the present disclosure.

Figure 1:
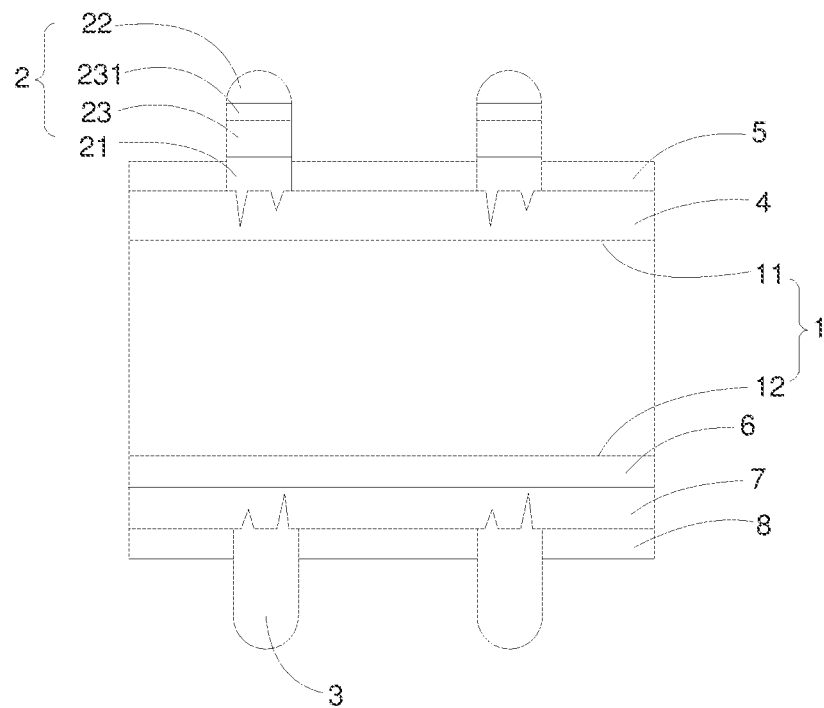
FIG. 1 is a schematic diagram of a solar cell according to one or more embodiments of the present disclosure.

The accompanying drawings herein, which are incorporated in and constitute a part of this specification, illustrate embodiments consistent with the present disclosure and, together with the specification, serve to explain principles of the present disclosure.

DESCRIPTION OF EMBODIMENTS

In order to better understand the technical solution of the present disclosure, embodiments of the present disclosure are described in detail below with reference to the accompanying drawings.

It should be made clear that the embodiments described are only some rather than all of the embodiments of the present disclosure. All other embodiments acquired by those of ordinary skill in the art without creative efforts based on the embodiments in the present disclosure fall within the protection scope of the present disclosure.

The terms used in the embodiments of the present disclosure are intended to describe particular embodiments and are not intended to limit the present disclosure. As used in the specification of the present disclosure and the appended claims, the singular forms of "a/an", "the", and "said" are intended to include plural forms, unless otherwise clearly specified in the context.

It should be understood that the term "and/or" used herein only describes an association relationship between associated objects and represents that three relationships may exist. For example, A and/or B may represent the following three cases: only A exists, both A and B exist, and only B exists. In addition, the character "/" herein generally means that associated objects before and after it are in an "or" relationship.

It is to be noted that positional terms such as "above", "below", "left", and "right" described in the embodiments of the present disclosure are described from the perspective shown in the drawings and should not be construed as limiting the embodiments of the present disclosure. In addition, in the context, it should be further understood that, when an element is referred to as "above" or "below" another element, it can be directly connected "above" or "below" another element, and can also be indirectly connected "above" or "below" another element through an intermediate element.

As shown in FIG. 1, some embodiments of the present disclosure provide a solar cell 10, including a substrate 1 and a first electrode 2. The first electrode 2 is arranged on a surface of the substrate 1 and is electrically connected to the substrate 1. Along a thickness direction of the substrate 1, the first electrode 2 includes a first conductive layer 21, a second conductive layer 22, and a first transport layer 23. The first transport layer 23 is located between the first conductive layer 21 and the second conductive layer 22, and the first transport layer 23 is made of a semiconductor material and is configured to electrically connect the first conductive layer 21 with the second conductive layer 22.

The first transport layer 23 is made of a semiconductor material, instead of a pure metal material, a metal oxide material, or an insulating material, and conductivity of the first transport layer 23 is between a conductor and an insulator. The first conductive layer 21 and the second conductive layer 22 may be manufactured by metal paste, so the first conductive layer 21 and the second conductive layer 22 may have relatively good conductivity. In some embodiments of the present disclosure, the first electrode 2 may adopt a stacked structural design. The first electrode 2 includes three layers, and the first transport layer 23 is arranged between the first conductive layer 21 and the second conductive layer 22. The first transport layer 23 can be physically isolated from and electrically connected the first conductive layer 21 and the second conductive layer 22, which reduces the possibility of direct contact between the first conductive layer 21 and the second conductive layer 22 and, at the same time, realizes electrical connection between the first conductive layer 21 and the second conductive layer 22.

In a current solar cell, a metal electrode may be arranged on a surface of a silicon substrate. The metal electrode may be manufactured by metal paste. In a process of sintering the metal paste, a sharp wedge effect may occur. That is, electrode grains of the metal electrode may form a wedge-like structure and contact the silicon substrate, and may penetrate the silicon substrate. The sharp wedge effect easily leads to an increase in recombination of the solar cell and affects a short-circuit voltage and cell efficiency of the solar cell. In the related art, the metal electrode is generally a pure metal electrode, such as a pure silver electrode or a silver-aluminum electrode. Such electrodes are prone to the sharp wedge effect when electrically connected to the substrate, leading to an increase in the recombination of the solar cell and a decrease in the short-circuit voltage and the cell efficiency of the solar cell. On the other hand, in order to ensure electrical properties of the electrode, in the related art, a sufficient amount of metal paste may generally be used to manufacture the electrode, and the metal paste may include noble metal elements such as silver, resulting in higher manufacturing costs of the electrode, thereby increasing manufacturing costs of the solar cell.

Compared with the related art, through the stacked structure of the first electrode 2 in the solar cell 10 according to embodiments of the present disclosure, the structure of the first electrode 2 includes three layers, i.e., the first conductive layer 21, the second conductive layer 22, and the first transport layer 23, so that the first conductive layer 21 and the second conductive layer 22 are physically isolated through the first transport layer 23, and current transport can be realized through the first transport layer 23. Since the first transport layer 23 is made of a semiconductor material, the first transport layer 23 helps to reduce conductivity between the first conductive layer 21 and the second conductive layer 22 and, at the same time, helps to reduce the possibility of direct contact between the first conductive layer 21 and the second conductive layer 22. That is, the possibility of direct electrical connection between the first conductive layer 21 and the second conductive layer 22 is reduced, thereby helping to reduce the possibility that electrode grains in the first conductive layer 21 and electrode grains in the second conductive layer 22 are mutually doped and diffuse toward the substrate 1 together that may lead to the sharp wedge effect. This design, while ensuring the first electrode 2 to have good current transport capability, also helps to reduce the possibility of penetration of electrode grains of the first electrode 2 into the substrate 1. That means, this structure helps to reduce the possibility of the sharp wedge effect of the solar cell 10, thereby helping to reduce recombination loss of the solar cell 10 and improving the short-circuit voltage and cell efficiency of the solar cell 10. Moreover, through the stacked structural design, the respective materials of the first conductive layer 21 and the second conductive layer 22 can be designed separately, so that on the premise that the two can be electrically connected, a lower-cost material can be provided on one of the layers, to reduce the usage amount of high-cost metal paste, thereby helping to reduce manufacturing costs of the first electrode 2 and then helping to reduce manufacturing costs of the entire solar cell 10.

In some embodiments, conductivity of the first conductive layer 21 and conductivity of the second conductive layer 22 are greater than conductivity of the first transport layer 23.

The first conductive layer 21 and the second conductive layer 22 may be made of metal materials, such as metal aluminum, metal silver copper, or metal nickel, while the first transport layer 23 is made of a semiconductor material, such as polycrystalline silicon or microcrystalline silicon. Therefore, the conductivity of the first conductive layer 21 and the conductivity of the second conductive layer 22 may be greater than the conductivity of the first transport layer 23. At room temperature, the conductivity of the first transport layer 23 may range from 0.1 S/m to 10 S/m. For example, the conductivity of the first transport layer 23 may be 0.1 S/m, 3 S/m, 5 S/m, 8 S/m, or 10 S/m. The first conductive layer 21 and the second conductive layer 22 may also be different in conductivity due to different metal components included therein. The first conductive layer 21 may be located on one side of the first transport layer 23 close to the substrate 1, and the conductivity thereof may range from 60 S/m to 100 S/m. For example, the conductivity of the first conductive layer 21 may be 60 S/m, 75 S/m, 85 S/m, 95 S/m, or 100 S/m. The second conductive layer 21 may be located on one side of the first transport layer 23 away from the substrate 1, and the conductivity thereof may range from 40 S/m to 60 S/m. For example, the conductivity of the second conductive layer 22 may be 40 S/m, 45 S/m, 50 S/m, 55 S/m, or 60 S/m.

In this way, the first transport layer 23 can realize the electrical connection between the first conductive layer 21 and the second conductive layer 22, and can also reduce the conductivity between the first conductive layer 21 and the second conductive layer 22. That is, the first transport layer 23 plays the role of a semiconductor, thereby reducing the possibility of the sharp wedge effect of the solar cell 10 while ensuring electrical properties of the first electrode 2.

In some embodiments, the semiconductor material includes at least one of polycrystalline silicon, microcrystalline silicon, amorphous silicon, or nanocrystalline silicon.

The first transport layer 23 may include one or more of the materials such as polycrystalline silicon, microcrystalline silicon, amorphous silicon, or nanocrystalline silicon. Such semiconductor materials may be intrinsic semiconductor materials, or doped semiconductor materials doped with other elements. For example, a doping polarity of a doped semiconductor may be either P-type or N-type, depending on a doping element.

With the arrangement of the first transport layer 23 as a semiconductor layer, the electrical connection between the first conductive layer 21 and the second conductive layer 22 can be realized while the first conductive layer 21 can also be physically isolated from the second conductive layer 22 is realized, so that the first electrode 2 can achieve relatively good current transport performance.

As shown in FIG. 1, in some embodiments, the first transport layer 23 is a doped semiconductor layer, a doped region 231 is formed between the first transport layer 23 and the first conductive layer 21 and/or the second conductive layer 22, and the doped region 231 is a P-type doped region or an N-type doped region.

In some embodiments, when the first transport layer 23 is a doped semiconductor, since the materials of the first conductive layer 21 and the second conductive layer 22 are different from the material of the first transport layer 23, part of component elements in the first conductive layer 21 and/or the second conductive layer 22 may be doped into the first transport layer 23 to form the doped region 231. A doping polarity of the doped region 231 may be P-type or N-type depending on the materials of the first conductive layer 21, the second conductive layer 22, and the first transport layer 23. The doping polarity of the doped region 231 is required to be the same as the first transport layer 23. For example, when the first transport layer 23 is P-type polycrystalline silicon, the doping polarity of the doped region 231 formed by the conductive layer and the first transport layer 23 is also P-type.

The doping polarity of the doped region 231 is kept the same as the first transport layer 23, which is beneficial to reduce the possibility of the influence of the doped region 231 on the performance of the first transport layer 23, thereby facilitating the first transport layer 23 to act as a semiconductor and realizing functions of physically isolation and electrically connection the first conductive layer 21 and the second conductive layer 22.

In some embodiments, the first transport layer 23 is an intrinsic semiconductor layer. In some embodiments, in the first electrode 2, the first transport layer 23 may be an intrinsic semiconductor. The intrinsic semiconductor is a pure semiconductor including no doping elements. Compared with the doped semiconductor, the intrinsic semiconductor has weaker conductivity. The first transport layer 23 may be selected from the doped semiconductor and the intrinsic semiconductor, which is conducive to improving the usage range of the first electrode 2, so as to meet use requirements of different solar cells 10.

In some embodiments, the first conductive layer 21 and the second conductive layer 22 are metallic material layers, and the metal components included in the first conductive layer 21 are different from those included in the second conductive layer 22.

The first conductive layer 21 and the second conductive layer 22 may be manufactured by corresponding metal paste. Metal components included in the metal paste are different. It is to be noted that component elements included in the first conductive layer 21 and the second conductive layer 22 may be of a same type, but proportions of the component elements in the two are different from each other. In some embodiments, the first conductive layer 21 and the second conductive layer 22 may both be sintered by silver-aluminum paste. That is, the component elements of the two are both a silver element and an aluminum element. However, the ratio of the silver element to the aluminum element in the first conductive layer 21 is different from the ratio in the second conductive layer 22. In some embodiments, in the first conductive layer 21, a mass fraction of the silver element is about 85% to 92%, and a mass fraction of the aluminum element is about 0.5% to 3%, while in the second conductive layer 22, a mass fraction of the silver element is about 0% to 2%, and a mass fraction of the aluminum element is about 70% to 95%. For example, the content of the silver element in the second conductive layer may be 0.

Since the first conductive layer 21 and the second conductive layer 22 are metallic material layers, the first conductive layer 21 and the second conductive layer 22 have higher conductivity than the first transport layer 23 (the semiconductor layer), helping to realize good electrical connection relationship between the first electrode 2 and the substrate 1, thereby helping to improve stability of operation of the solar cell 10. On the other hand, compared with the first conductive layer 21, the content of the silver element in the second conductive layer 22 is greatly reduced, thereby helping to save the amount of silver used in the first electrode 2 and then helping to reduce manufacturing costs of the first electrode 2.

In some embodiments, the first conductive layer 21 is located on one side of a surface of the first transport layer 23 close to the substrate 1, the first conductive layer 21 is sintered by silver-aluminum paste, and the second conductive layer 22 is sintered by aluminum paste or silver-aluminum paste.

The second conductive layer 22 may be located on one side of the first transport layer 23 away from the substrate 1. The second conductive layer 22 may include a small amount of silver element or does not include the silver element. That is, the second conductive layer 22 may be a pure metal aluminum layer. In the first electrode 2, to enable the first conductive layer 21 to form good electrical connection with the substrate 1 and enable the first electrode 2 to have low resistance and good current transport capability, the second conductive layer 22 may be manufactured with a sufficient amount of aluminum paste. Moreover, the cost of the aluminum paste is relatively low, and the use of the aluminum paste is conducive to reducing the manufacturing costs of the first electrode 2. In one or more embodiments, the first transport layer 23 may be a doped semiconductor layer, and a doping polarity thereof may be P-type. In this case, a small amount of the aluminum element in the second conductive layer 22 may be diffused into the first transport layer 23. Since the aluminum element may form P-type doping in the first transport layer 23, the doping polarity of the doped region 231 is the same as the first transport layer 23.

In the related art, the manufacturing of the metal electrode generally requires a sufficient amount of silver-aluminum paste. The cost of silver is high, which leads to an increase in the manufacturing costs of the entire solar cell. Moreover, the sufficient amount of silver-aluminum paste also easily causes the solar cell to produce the sharp wedge effect, this is because the solubility of silicon element in the substrate is relatively large in the aluminum element. When the silicon element in the substrate diffuses into the metal electrode, the aluminum element in the metal electrode may also diffuse into the substrate. In this case, if the silicon element and the aluminum element are not uniformly diffused, the aluminum element may form a wedge structure on the silicon substrate (i.e., sharp wedge effect), thereby affecting the performance of the solar cell.

Compared with the related art, in some embodiments of the present disclosure, through the stacked design of the first electrode 2, the first conductive layer 21 and the second conductive layer 22 may be made of different metal materials, and usage costs of the aluminum paste are relatively low, so this design can help to reduce the usage amount of the silver-aluminum paste, which is beneficial to reduce the usage amount of silver, thereby helping to reduce manufacturing costs of the electrode and thus the costs of the solar cell 10. On the other hand, the use of the sufficient amount of aluminum paste enables the first electrode 2 to have good electrical properties, and the arrangement of the first transport layer 23 between the first conductive layer 21 and the second conductive layer 22 is beneficial to reduce the possibility of diffusion of the aluminum element in the second conductive layer 22 into the first conductive layer 21, thereby helping to reduce the content of the aluminum element in the first conductive layer 21 and reduce the possibility of the sharp wedge effect of the solar cell 10, thereby reducing recombination loss of the solar cell 10 and thus improving the short-circuit voltage and cell efficiency of the solar cell 10.

In some embodiments, along the thickness direction of the substrate 1, a thickness D1 of the first conductive layer 21 satisfies: 1 µm≤D1≤10 µm, a thickness D2 of the first transport layer 23 satisfies: 10 µm≤D2≤1000 and a thickness D3 of the second conductive layer 22 satisfies: 5 µm≤D3≤50 µm.

For example, the thickness D1 of the first conductive layer 21 may be 1 µm, 3 µm, 5 µm, 8 µm, or 10 µm, or other values in the above range, which is not limited herein.

For example, the thickness D2 of the first transport layer 23 may be 10 µm, 50 µm, 100 µm, 500 µm, or 1000 µm, or other values in the above range, which is not limited herein.

For example, the thickness D3 of the second conductive layer 22 may be 5 µm, 10 µm, 20 µm, 35 µm or 50 µm, or other values in the above range, which is not limited herein.

The design of the thickness of the first conductive layer 21, the first transport layer 23, and the second conductive layer 22 is beneficial to meet use requirements of the first electrode 2 for each of these layers, and to the use of the first electrode 2 in the solar cell 10 to reduce the possibility of the sharp wedge effect of the solar cell 10, which effectively helps to reduce the manufacturing costs of the first electrode 2.

Figure 2:
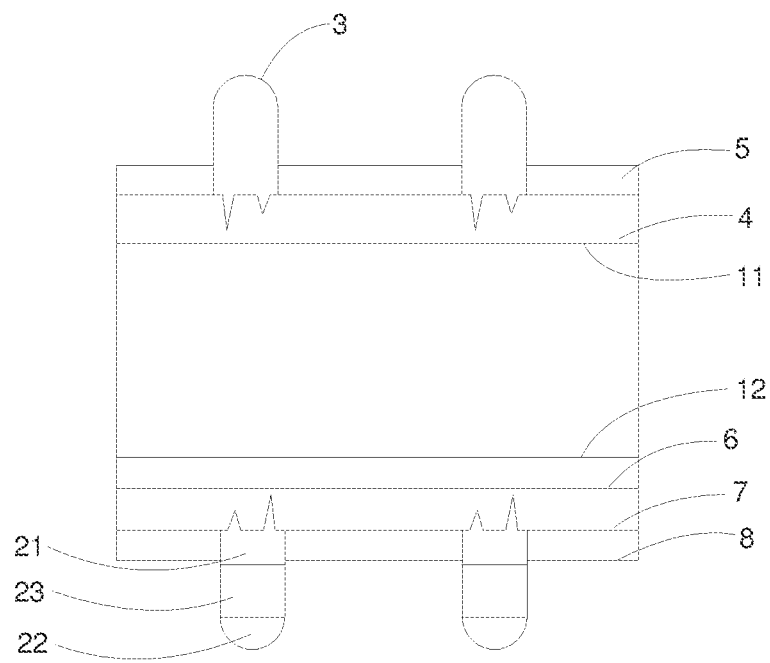
FIG. 2 is a schematic diagram of another solar cell according to one or more embodiments of the present disclosure.

As shown in FIG. 1 and FIG. 2, in some embodiments, the substrate 1 has a first surface 11 and a second surface 12 opposite to each other along the thickness direction, and the solar cell 10 further includes a second electrode 3. The second electrode 3 can be electrically connected with the substrate 1, and one of the first surface 11 and the second surface 12 is provided with the first electrode 2 and the other is provided with the second electrode 3.

In some embodiments, the first surface 11 may be a front surface of the substrate 1, that is, a surface facing the sun, and configured to receive sunlight, and the second surface 12 may be a rear surface of the substrate 1. The first electrode 2 and the second electrode 3 may be arranged on the first surface 11 and the second surface 12, respectively. The second electrode 3 may be a pure metal electrode. That is, the second electrode 3 may be an electrode without a stacked structure. For example, the second electrode 3 may be a pure silver electrode. The second electrode 3 may be arranged on the rear surface of the substrate 1, while the first electrode 2 is arranged on the front surface of the substrate 1. In some embodiments, the second electrode 3 may be arranged on the front surface of the substrate 1, while the first electrode 2 is arranged on the rear surface of the substrate 1.

This design is conducive to improving flexibility of the use of the first electrode 2. With the cooperation of the second electrode 3, the first electrode 2 may be arranged on the front surface of the substrate 1 or the rear surface of the substrate 1 according to an actual use requirement of the solar cell 10, thereby helping to improve the performance of the solar cell 10 and reducing the manufacturing costs of the solar cell 10.

Figure 3:
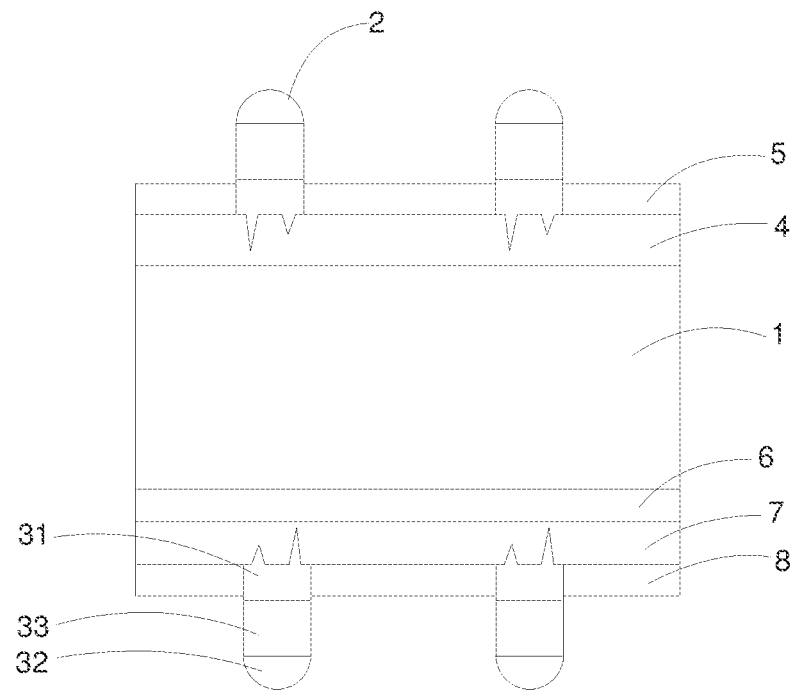
FIG. 3 is a schematic diagram of still another solar cell according to one or more embodiments of the present disclosure.

As shown in FIG. 3, in some embodiments, the second electrode 3 is provided with a third conductive layer 31, a fourth conductive layer 32, and a second transport layer 33 along the thickness direction. The second transport layer 33 is located between the third conductive layer 31 and the fourth conductive layer 32, and the second transport layer 33 is made of a semiconductor material and configured to electrically connect the third conductive layer 31 with the fourth conductive layer 32.

In some embodiments, the second electrode 3 may have a same stacked structure as the first electrode 2. Both the third conductive layer 31 and the fourth conductive layer 32 may be metallic material layers, and the second transport layer 33 may be an intrinsic semiconductor layer or a doped semiconductor layer. Conductivity of the second transport layer 33 is less than the third conductive layer 31 and the fourth conductive layer 32. The second electrode 3 and the first electrode 2 may be identical in structure, and the materials of the third conductive layer 31, the second transport layer 33, and the fourth conductive layer 32 in the second electrode 3 may be different from those of the first electrode 2, which may be set according to an actual use requirement of the solar cell 10.

The arrangement enables two sides of the substrate 1 to be provided with electrodes with a stacked structure, thereby further helping to reduce the possibility of the sharp wedge effect occurring on the two sides of the substrate 1 and reduce recombination loss of the solar cell 10, and thus improving the cell efficiency of the solar cell 10. On the other hand, this design further helps to save the usage amount of noble metals such as silver, thereby helping to reduce the manufacturing costs of the solar cell 10.

Figure 4:
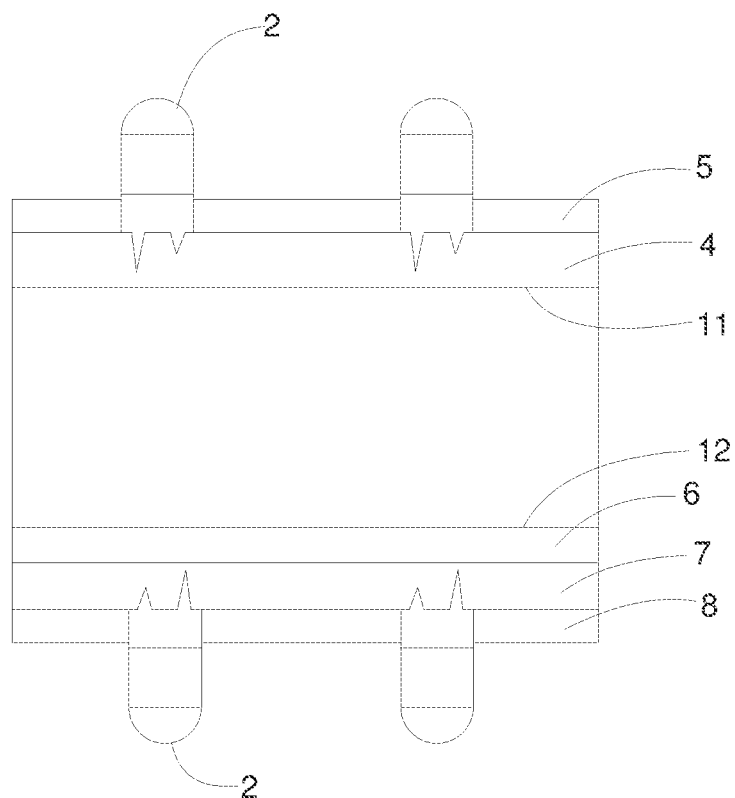
FIG. 4 is a schematic diagram of yet still another solar cell according to one or more embodiments of the present disclosure.

As shown in FIG. 4, in some embodiments, the substrate 1 has a first surface 11 and a second surface 12 opposite to each other along the thickness direction, and the first electrode 2 is arranged on the first surface 11 and the second surface 12.

In one or more embodiments, the front surface and the rear surface of the substrate 1 may both include the first electrode 2. When the first transport layers 23 of the two first electrodes 2 are doped semiconductor layers, and the doping polarities of the two first transport layers 23 may be opposite.

The arrangement of the first electrodes 2 on the two sides of the substrate 1 also helps to reduce the possibility of the sharp wedge effect occurring on the two sides of the substrate 1 and reduce recombination loss of the solar cell 10, which improves the cell efficiency of the solar cell 10, and is conducive to saving the usage amount of silver paste, thereby reducing the manufacturing costs of the solar cell 10.

As shown in FIG. 4, in some embodiments, along a direction away from the substrate 1, the first surface 11 is successively provided with an emitter 4 and a first passivation film 5. The first electrode 2 is arranged on one side of the first passivation film 5 away from the emitter 4, and the first electrode 2 can penetrate through the first passivation film 5 and is electrically connected to the emitter 4.

In some embodiments, the first surface 11 may be the front surface of the substrate 1, and the substrate 1 and the emitter 4 may jointly form a PN junction structure. The substrate 1 may be a P-type silicon substrate, the emitter 4 may be an N-type emitter, and the P-type silicon substrate and the N-type emitter may jointly form the PN junction structure. For example, the substrate 1 may be an N-type silicon substrate, and the emitter 4 may be a P-type emitter. The substrate 1 includes, but is not limited to, a monocrystalline silicon substrate, a polycrystalline silicon substrate, a nanocrystalline silicon substrate, and the like. A first passivation film 5 is arranged on one side of the emitter 4 away from the substrate 1. The first passivation film 5 may provide passivation effect on the first surface 11, thereby helping to improve the performance of the solar cell 10. In some embodiments, the first passivation film 5 may include components such as silicon nitride and aluminum oxide, and the first passivation film 5 may adopt a stacked structure. The refractive index and the thickness of each layer may be designed according to different requirements.

The arrangement of the first electrode 2 on the front surface of the substrate 1 is beneficial to reduce the possibility of penetration of the electrode grains of the first electrode 2 into the emitter 4, and then beneficial to reduce the possibility of the sharp wedge effect on the front surface of the substrate 1, thereby helping to reduce recombination loss of the solar cell 10, improving the short-circuit voltage and cell efficiency of the solar cell 10, and helping to reduce the manufacturing costs of the entire solar cell 10.

In some embodiments, the substrate 1 is a silicon substrate with a first doping polarity, and the first transport layer 23 is a semiconductor layer with a second doping polarity. The first doping polarity is opposite to the second doping polarity.

When the substrate 1 is an N-type silicon substrate, the first transport layer 23 of the first electrode 2 connected to the front surface of the substrate 1 may be a P-type semiconductor layer. When the substrate 1 is a P-type silicon substrate, the first transport layer 23 may be an N-type semiconductor layer. Moreover, when the first electrode 2 is arranged on the front surface of the substrate 1, the doping polarity of the first transport layer 23 may be the same as the emitter 4.

The design is conducive to improving stability of the performance of the emitter 4, reduces the possibility of the influence of the first electrode 2 on the performance of the emitter 4, and then helps to improve stability of the PN junction structure formed between the substrate 1 and the emitter 4, thereby helping to ensure the performance of the solar cell 10.

As shown in FIG. 4, in some embodiments, along a direction away from the substrate 1, the second surface 12 is successively provided with a tunneling layer 6, a doped conductive layer 7, and a second passivation film 8. The first electrode 2 is arranged on one side of the second passivation film 8 away from the tunneling layer 6, and the first electrode 2 can penetrate through the second passivation film 8 and is electrically connected to the doped conductive layer 7.

In some embodiments, the second surface 12 may be the rear surface of the substrate 1, and the tunneling layer 6 may be a silicon oxide layer, with a thickness set in a range from 0.5 nm to 2.5 nm. The tunneling layer 6 can be used as a tunneling layer for majority carriers, and the surface of the substrate 1 can be subjected to chemical passivation at the same time to reduce interface states. The doped conductive layer 7 can form energy band bending on the rear surface of the substrate 1 and realize selective transport of carriers, which helps to reduce recombination loss and ensures transport efficiency of the carriers. When the substrate 1 is an N-type silicon substrate, the doped conductive layer 7 may be an N-type polycrystalline silicon layer. The first electrode 2 may be electrically connected to the doped conductive layer 7, and the first electrode 2 does not penetrate the tunneling layer 6, so as to maintain good interface passivation effect. The second passivation film 8 may include components such as silicon nitride and aluminum oxide, and can achieve passivation effect on the rear surface of the substrate 1. The second passivation film 8 may also adopt a stacked structure. The refractive index and the thickness of each layer in the second passivation film 8 may be designed accordingly, so that the second passivation film 8 can be used as an optical matching layer of the solar cell 10.

The arrangement of the first electrode 2 on the rear surface of the substrate 1 is beneficial to reduce the possibility of penetration of the electrode grains of the first electrode 2 into the tunneling layer 6, and then beneficial to reduce the possibility of the sharp wedge effect on the rear surface of the substrate 1, thereby helping to reduce recombination loss of the solar cell 10, improving the short-circuit voltage and cell efficiency of the solar cell 10, and helping to reduce the manufacturing costs of the entire solar cell 10.

In some embodiments, the substrate 1 is a silicon substrate with a first doping polarity, the first transport layer 23 is a semiconductor layer with a second doping polarity, the first doping polarity is the same as the second doping polarity, and the second doping polarity is the same as the doping polarity of the doped conductive layer 7.

In some embodiments, when the substrate 1 is an N-type silicon substrate, the first transport layer 23 of the first electrode 2 connected to the rear surface of the substrate 1 may be an N-type semiconductor layer, and the doped conductive layer 7 is also an N-type doped conductive layer.

This design is beneficial to reduce the possibility of the influence of the first electrode 2 on the performance of the doped conductive layer 7, thereby helping to enable the doped conductive layer 7 to achieve passivation effect on the rear surface of the substrate 1 and then helping to enable the doped conductive layer 7 to realize selective transport of the carriers, which reduces the recombination loss of the solar cell 10 and helps to improve the cell efficiency of the solar cell 10.

Figure 5:
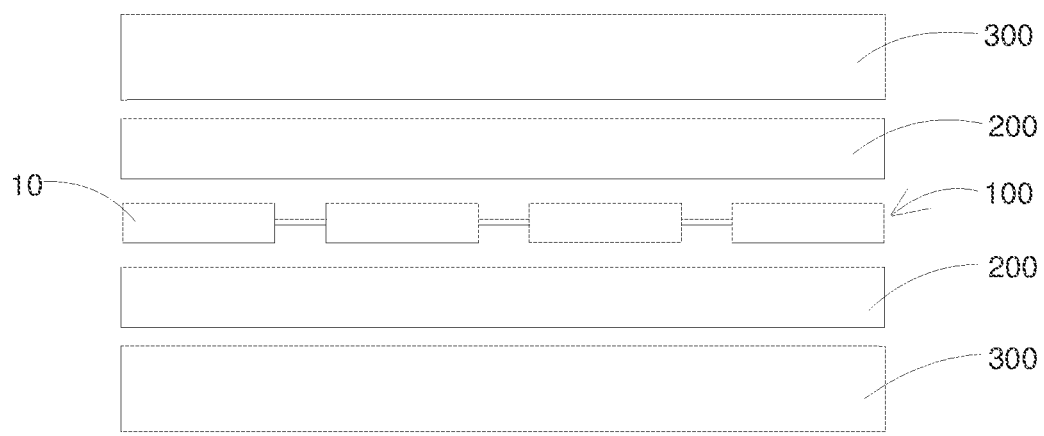
FIG. 5 is a schematic diagram of a photovoltaic module according to some embodiments of the present disclosure.

As shown in FIG. 5, some embodiments of the present disclosure further provide a photovoltaic module, including at least one solar cell string 100, a packaging layer 200, and a cover plate 300. The solar cell string 100 is formed by electrically connecting a plurality of solar cells 10 described above. The packaging layer 200 is configured to cover the surface of the solar cell string 100. The cover plate 300 is configured to cover the surface of the packaging layer 200 away from the solar cell string 100.

In the solar cell string 100, the plurality of solar cells 10 are electrically connected in series and/or in parallel. The cover plate 300, the packaging layer 200, and the solar cell string 100 may be pressed in a specific order through a lamination process to obtain a stacked assembly, and then a frame may be mounted on the stacked assembly to form the photovoltaic module. The photovoltaic module can play a role of photoelectric conversion through the solar cell string 100, that is, can convert light energy absorbed by the solar cell 10 into electrical energy.

The above are merely preferred embodiments of the present disclosure and are not intended to limit the present disclosure. For those skilled in the art, the present disclosure may be subject to various changes and variations. Any modification, equivalent replacement, improvement, and the like made within the spirit and principles of the present disclosure shall fall within the protection scope of the present disclosure.

What is claimed is:

1. A solar cell, comprising:
    a substrate having a first surface and a second surface opposite to each other; and
    at least one first electrode arranged on and electrically connected to the substrate, wherein each first electrode includes, along a thickness direction of the substrate, a first conductive layer, a second conductive layer, and a first transport layer, the first transport layer is located between the first conductive layer and the second conductive layer, and the first transport layer is made of a semiconductor material and configured to electrically connect the first conductive layer with the second conductive layer,
    wherein, along a direction away from the substrate, the first surface is successively provided with an emitter and a first passivation film,
    wherein the at least one first electrode includes a first electrode arranged on the first surface of the substrate, the first electrode arranged on the first surface of the substrate is arranged on one side of the first passivation film away from the emitter, and the first electrode arranged on the first surface of the substrate penetrates through the first passivation film and is electrically connected to the emitter, and
    wherein the substrate is a silicon substrate having a first doping polarity, the first transport layer of the first electrode on the first surface of the substrate is a doped semiconductor layer having a second doping polarity opposite to the first doping polarity.

2. The solar cell according to claim 1, wherein an electrical conductivity of the first conductive layer and an electrical conductivity of the second conductive layer are greater than an electrical conductivity of the first transport layer.

3. The solar cell according to claim 2, wherein the semiconductor material comprises at least one of polycrystalline silicon, microcrystalline silicon, amorphous silicon, or nanocrystalline silicon.

4. The solar cell according to claim 3, wherein a doped region is formed between the first transport layer and the first conductive layer and/or the second conductive layer, and the doped region is a P-type doped region or an N-type doped region.

5. The solar cell according to claim 1, wherein the first conductive layer and the second conductive layer are metallic material layers, metal components in the first conductive layer are different from the second conductive layer.

6. The solar cell according to claim 1, wherein the first conductive layer is located on one side of a surface of the first transport layer close to the substrate, the first conductive layer is sintered by a silver-aluminum paste, and the second conductive layer is sintered by an aluminum paste or a silver-aluminum paste.

7. The solar cell according to claim 1, wherein, along the thickness direction of the substrate, a thickness D1 of the first conductive layer satisfies: 1 μm≤D1≤10 μm.

8. The solar cell according to claim 1, wherein, along the thickness direction of the substrate, a thickness D2 of the first transport layer satisfies: 10 μm≤D2≤1000 μm.

9. The solar cell according to claim 1, wherein, along the thickness direction of the substrate, a thickness D3 of the second conductive layer satisfies: 5 μm≤D3≤50 μm.

10. The solar cell according to claim 1, wherein the solar cell further comprises a second electrode electrically connected with the substrate, and the second surface of the substrate is provided with the second electrode.

11. The solar cell according to claim 10, wherein the second electrode includes a third conductive layer, a fourth conductive layer, and a second transport layer along the thickness direction, the second transport layer is located between the third conductive layer and the fourth conductive layer, and the second transport layer is made of a semiconductor material and configured to electrically connect the third conductive layer with the fourth conductive layer.

12. The solar cell according to claim 1, wherein, along a direction away from the substrate, the second surface is successively provided with a tunneling layer, a doped conductive layer, and a second passivation film, and wherein the at least one first electrode further includes a first electrode arranged on the second surface of the substrate, the first electrode on the second surface of the substrate penetrates through the second passivation film and is electrically connected to the doped conductive layer.

13. The solar cell according to claim 12, wherein the silicon substrate, the first transport layer of the first electrode on the second surface of the silicon substrate, and the doped conductive layer have a same doping polarity.

14. A photovoltaic module, comprising:
a solar cell string formed by electrically connecting a plurality of solar cells;
a first packaging layer covering a first surface of the solar cell string;
a second packaging layer covering a second surface of the solar cell string;
a first cover plate covering a surface of the first packaging layer away from the solar cell string; and
a second cover plate covering a surface of the second packaging layer away from the solar cell string,
wherein at least one of the plurality of solar cells includes:
a substrate having a first surface and a second surface opposite to each other; and
at least one first electrode arranged on and electrically connected to the substrate, wherein the at least one first electrode includes, along a thickness direction of the substrate, a first conductive layer, a second conductive layer, and a first transport layer, the first transport layer is located between the first conductive layer and the second conductive layer, and the first transport layer is made of a semiconductor material and configured to electrically connect the first conductive layer with the second conductive layer,
wherein, along a direction away from the substrate, the first surface is successively provided with an emitter and a first passivation film,
wherein the at least one first electrode includes a first electrode arranged on the first surface of the substrate, the first electrode arranged on the first surface of the substrate is arranged on one side of the first passivation film away from the emitter, and the first electrode arranged on the first surface of the substrate penetrates through the first passivation film and is electrically connected to the emitter, and
wherein the substrate is a silicon substrate having a first doping polarity, the first transport layer of the first electrode on the first surface of the substrate is a doped semiconductor layer having a second doping polarity opposite to the first doping polarity.

15. The photovoltaic module according to claim 14, wherein the solar cell further comprises a second electrode electrically connected with the substrate, and the second surface of the substrate is provided with the second electrode.

16. The photovoltaic module according to claim 14, wherein along a direction away from the substrate, the second surface is successively provided with a tunneling layer, a doped conductive layer, and a second passivation film, wherein the at least one first electrode further includes a first electrode arranged on the second surface of the substrate, the first electrode on the second surface of the substrate penetrates through the second passivation film and is electrically connected to the doped conductive layer, and wherein the silicon substrate, the first transport layer of the first electrode on the second surface of the silicon substrate, and the doped conductive layer have a same doping polarity.

17. A solar cell, comprising:
a silicon substrate having a first surface and a second surface opposite to each other; and
at least one first electrode,
the at least one first electrode comprises a first electrode arranged on the second surface of the silicon substrate and electrically connected to the silicon substrate, wherein the first electrode on the second surface of the silicon substrate includes, along a thickness direction of the silicon substrate, a first conductive layer, a second conductive layer, and a first transport layer, the first transport layer is located between the first conductive layer and the second conductive layer, and the first transport layer is made of a semiconductor material and configured to electrically connect the first conductive layer with the second conductive layer,
wherein, along a direction away from the silicon substrate, the second surface is successively provided with a tunneling layer, a doped conductive layer, and a second passivation film,
wherein the first electrode on the second surface of the silicon substrate is arranged on one side of the second passivation film away from the tunneling layer, penetrates through the second passivation film, and is electrically connected to the doped conductive layer, and
wherein the silicon substrate, the first transport layer of the first electrode on the second surface of the silicon substrate, and the doped conductive layer have a same doping polarity.

18. The solar cell according to claim 17, wherein the at least one first electrode further comprises a first electrode arranged on the first surface of the silicon substrate and electrically connected to the silicon substrate,
wherein along a direction away from the substrate, the first surface is successively provided with an emitter and a first passivation film, the first electrode on the first surface of the silicon substrate is arranged on one side of the first passivation film away from the emitter, and the first electrode on the first surface of the silicon substrate penetrates through the first passivation film and is electrically connected to the emitter, and
wherein the silicon substrate and the first transport layer of the first electrode on the first surface of the silicon substrate have opposite doping polarities.

19. The solar cell according to claim 17, further comprising a second electrode arranged on the first surface of the silicon substrate.

20. The solar cell according to claim 17, wherein the semiconductor material of the first transport layer comprises at least one of polycrystalline silicon, microcrystalline silicon, amorphous silicon, or nanocrystalline silicon.

* * * * *